United States Patent [19]
Michel et al.

[11] Patent Number: 5,407,525
[45] Date of Patent: Apr. 18, 1995

[54] METHOD OF FREQUENCY TUNING A PIEZOELECTRIC DEVICE AND APPARATUS FOR THE IMPLEMENTATION OF THE METHOD

[75] Inventors: Jean-Philippe Michel, Courbevoie; Michaël Zafrany, Issy les Moulineaux, both of France

[73] Assignee: Compagnie d'Electronique et de Piezo-Electricite C.E.P.E., Argenteuil, France

[21] Appl. No.: 170,767

[22] Filed: Dec. 21, 1993

[30] Foreign Application Priority Data

Dec. 22, 1992 [FR] France ................ 92 15475

[51] Int. Cl.⁶ .......................... B44C 1/22; C23F 1/00
[52] U.S. Cl. ..................... 156/627; 156/626; 156/643; 156/656; 156/345
[58] Field of Search .......... 156/626, 643, 627, 656, 156/664, 345; 29/25.35; 310/312; 427/100, 331

[56] References Cited

U.S. PATENT DOCUMENTS 4,638,536  1/1987  Vig ........................ 29/25.35

FOREIGN PATENT DOCUMENTS 0218120  1/1985  Germany ................ 156/627

OTHER PUBLICATIONS

Patent Abstracts of Japan, vol. 016, No. 526, Oct. 28, 1992 & JP-A-41 96 708, Hanji Motoyasu, "Frequency Adjustment Device and Method for Piezeoelectric Element."

Patent Abstracts of Japan, vol. 016, No. 526, Oct. 28, 1992 & JP-A ∝ 41 96 610, Akaha Takashi, "Frequency Adjustment Method for Piezoelectric Vibrator."

Castellano, R. H., et al., Proc. of the 29th Annual Frequency Control Symposium, 1975, pp. 128–134, "A Survey of Ion Beam Milling Techniques for Piezoelectric Device Fabrication."

*Primary Examiner*—William Powell
*Attorney, Agent, or Firm*—Oblon, Spivak, McClelland, Maier & Neustadt

[57] ABSTRACT

A method of frequency tuning a piezoelectric device and apparatus for the implementation thereof. A piezoelectric device having at least one resonating function is formed by two metallized electrodes facing each other, on a face of a plate made of a piezoelectric material. An arranging step arranges the plate, fitted with the electrodes, in a tuning position in proximity to an ion source. Then, an exposing step exposes the plate to an ion flux produced by the source and the ions etch the metal. A measuring step measures the resonant frequency of the resonating function while the plate is in a tuning position. Finally, a raising step raises at least one electrode exposed to the ions to an adjustable bias voltage to control the rate at which the metal on the electrode is etched.

12 Claims, 2 Drawing Sheets

METHOD OF FREQUENCY TUNING A PIEZOELECTRIC DEVICE AND APPARATUS FOR THE IMPLEMENTATION OF THE METHOD

BACKGROUND OF THE INVENTION

1. Field of the Invention

The present invention relates to a method of frequency tuning a piezoelectric device and an apparatus for the implementation of the method.

2. Description of the Related Art

By piezoelectric device is meant a plate made of piezoelectric material comprising at least one resonating function formed by two electrodes facing each other, each on a different principal face of the plate. The plate is fixed to a base which comprises electrical connections connected to the electrodes.

A piezoelectric device may combine together a plurality of resonating functions on the same plate. When the electrodes of a plurality of resonating functions are very close to each other, the functions are mechanically coupled. The coupled resonating functions may have a common electrode. The electrodes are constituted by a metal layer deposited on the plate made of piezoelectric material.

The value of the resonant frequency of a resonating function is determined in the first instance by the thickness of the plate made of piezoelectric material, but also by the thickness of the metal of the electrodes. In the case where the resonating functions are mechanically coupled, the value of the coupling depends on the proximity of the electrodes from the two resonating functions, but also on the thickness of the metal of the electrodes.

Several methods are currently employed to tune the frequency of resonating functions. They divide into two categories. Metal addition methods consist in metalizing a plate initially lacking in metallization or in the overlaying of an already partially metallized plate. Metallization removal methods consist thinning down at least one predeposited electrode.

Among the metal addition methods, mention may be made of the electrolytic deposition of gold on at least one predeposited electrode. During this method, the electrode is electrically connected up to a controlled current source, of which it constitutes the cathode. The plate made of piezoelectric material is dipped into a bath of gold salts. Application of the current brings about the deposition of gold on the electrode. The control of the current, the temperature, the concentration, the pH and the immersion time enable the frequency tuning to be performed. This method enables a plurality of resonating functions to be frequency tuned. All that is required is to connect up at least one electrode for each resonating function to the current source. This method is difficult to automate because the measurement of the frequency of the resonating function can only be carried out while the plate made of piezoelectric material is immersed.

Mention may also be made of the vacuum deposition of metal. The plate made of piezoelectric material is introduced into a chamber in which a high vacuum is maintained and in which there are two metallization sources facing each other. The plate is already fixed to its base which comprises electrical connections, but the electrodes have not been deposited.

Masks are interposed between the sources and the plate. The masks have apertures corresponding the dimensions of the electrodes to be deposited. The masks are not in contact with the plates on account of the fixing and connection devices.

Movable shutters enable the apertures of the masks to be occulted as required. The frequency of each resonating function is measured during the metallization, which is deposited only at the locations left exposed by the apertures of the masks. As soon as the frequency of a resonating function has reached its target value, the apertures of the masks corresponding to the electrodes of this function are occulted by interposing the shutters. The main drawback of this method resides in the fact that the contour of the electrodes lacks precision since the masks are not in contact with the plate.

Among the removal methods, mention may be made of the chemical etching of the electrodes. In this method, the electrodes are predeposited on the plate made of piezoelectric material. At least one electrode is subjected to the action of a chemical agent etching the metal of the electrode. This action is applied by virtue of a pad imbibed with chemical agent. Discrimination of the electrodes is obtained by selective application of the pad. This method does not enable the frequency of the resonating functions to be measured during application of the pad. This method is limited toward high frequencies. In this case, the electrodes are very small (of the order of one hundredth of a square millimeter) and discrimination of one electrode among a plurality is not possible with the pad.

The method according to the invention is to overcome the drawbacks of the known methods.

SUMMARY OF THE INVENTION

The method according to the invention more particularly enables devices having a plurality of resonating functions to be frequency tuned. The present invention provides a method which makes it possible to frequency tune a piezoelectric device which can combine together any number of resonating functions on the same plate, which method does not use mechanical movements to differentiate the resonating functions and which does not alter the contour of the electrodes.

The present invention provides a method of frequency tuning a piezoelectric device comprising at least one resonating function formed by two metallized electrodes placed facing each other, each on a different face of a plate made of piezoelectric material. It consists:

arranging the plane made of piezoelectric material, fitted with electrodes metallized in excess, in a tuning position in proximity to an ion source;

exposing the plate to an ion flux produced by the source, the ion flux etching the metal;

in measuring the resonant frequency of the resonating function while the plate is in a tuning position;

in raising at least one electrode exposed to the ion flux to an adjustable bias voltage in such a way as to control the rate at which the metal on the electrode is etched.

When the plate made of piezoelectric material comprises a plurality of resonating functions, it is possible to adjust the bias voltage applied to one or more electrodes exposed to the ion flux to a value aiming to make the etching rate zero as soon as the resonating functions corresponding to these electrodes have reached a predetermined frequency target value.

A variant consists in adjusting the bias voltage applied to one or more electrodes exposed to the ion flux to a value chosen in order that all the resonating functions reach a predetermined frequency target value in the same exposure time.

The invention also provides a tuning apparatus for implementing the method. It comprises, in a sealed chamber, at least one ion gun producing an ion beam directed along an axis XX' toward one face of the plate made of piezoelectric material, means for measuring the resonant frequency of the resonating function, and means for applying the adjustable bias voltage to the electrode exposed to the ion flux.

BRIEF DESCRIPTION OF THE DRAWINGS

Other characteristics and advantages of the present invention will emerge on reading the description of particular embodiments given by way of example, and illustrated by the appended figures which show.

DESCRIPTION OF THE PREFERRED EMBODIMENTS

The frequency tuning method according to the invention is a metal removal method. The removal of metal is obtained by ion bombardment of the device to be tuned, bringing about erosion of the thickness of metal on the electrodes.

The method is particularly advantageous for the frequency tuning of piezoelectric devices combining together on the same plate a plurality of resonating functions, whether they are coupled or not.

The piezoelectric device comprises at least one resonating function formed by two metal electrodes placed facing each other, each on a different face of the plate. The piezoelectric device fitted with its electrodes metallized in excess is exposed to an ion flux.

The resonant frequency of the resonating function is measured during tuning.

At least one electrode of the resonating function, exposed to the ion flux, is raised to an adjustable bias voltage in such a way as to control the raze at which the metal of the electrode is eroded by the ion flux.

Figure 1A:
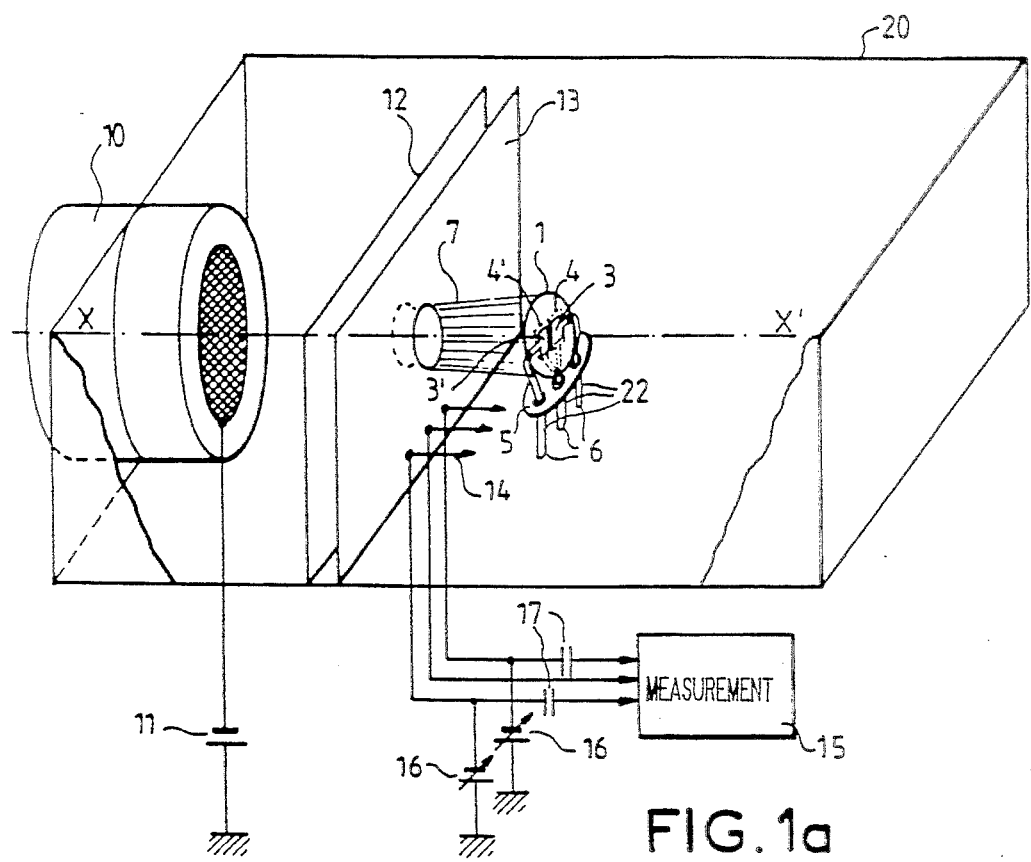
in FIG. 1a, a tuning apparatus according to the invention.
Figure 1B:
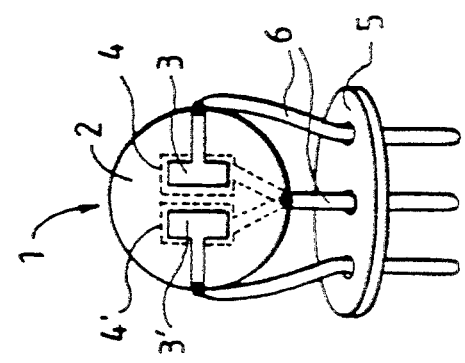
in FIG. 1b, a piezoelectric device to be tuned.

FIG. 1a shows a tuning apparatus according to the invention. A piezoelectric device to be frequency tuned is shown in detail in FIG. 1b. It bears the reference 1. This device has two uncoupled resonating functions. This is merely an example, it being possible to have a single resonating function, or more than two resonating functions. The resonating functions could be mechanically coupled.

The piezoelectric device comprises a plate 2 made of piezoelectric material fitted on one face with two metal electrodes 3 and 3' (one per resonating function) and on the other face also with two metal electrodes 4 and 4' (one per resonating function). The plate 2 is fixed to a base 5 by virtue of fixing elements 6 in the form of posts which pass through the base 5. The fixing elements 6 are conductors and are connected to the electrodes 3, 3', 4, 4'. They also serve as electrical connection for the electrodes. There are only three fixing elements 6, two for the electrodes 4, 4' of one face being connected up to the same fixing element 6.

The frequency tuning apparatus according to the invention can be used with other types of piezoelectric device. Any type of base or any type of plate can be used, as well as any transfer, mounting and electrical connection technology. In particular, the bases may be bases having a glass/metal seal and equipped with metal fixing springs connected up by adhesive bonding, soldering or brazing. These may also be ceramic or ceramic-based bases equipped with brazed metal springs which are intended for fixing where connection is achieved by adhesive bonding, soldering or brazing, or else with ceramic or ceramic-based bases where the fixing and the connection are achieved by means of adhesive.

The piezoelectric device 1, placed in a sealed chamber 20, is subjected to an ion flux 7. The ions of this flux are produced by a source such as an ion gun 10. In FIG. 1a there is only one ion gun. The ion gun 10 emits an ion beam 7 directed along an axis XX'.

When it is desired to tune a piezoelectric device having mechanically coupled resonating functions it is preferable to use two ion guns 10 (shown in FIG. 2) in such a way as to also to be able to act on the coupling.

An electric power supply 11 connected up to the gun 10 supplies a voltage for accelerating the ions.

A diaphragm 12 is provided between the ion gun 10 and the piezoelectric device in such a way as to limit the cross-section of the ion beam 7 to the area to be tuned, so as to prevent the fixing elements 6, the base 5 and the other surrounding elements described below from being etched. The diaphragm 12 is relatively close to the piezoelectric device 1 and it protects the surroundings from sprayed metal generated by the ion bombardment. The axis XX' passes close to the center of the diaphragm 12.

The plate 2 made of piezoelectric material has its faces substantially normal to the axis XX' in such a way that the electrodes 4, 4' are exposed to the ion flux.

Means are provided for measuring the frequency of the resonating functions of the piezoelectric device. A biasing device is also provided for biasing at lease one of the electrodes 4, 4' exposed to the ion flux.

FIG. 1a shows a measuring head 13. It is formed by test points 14 which come into contact with conducting zones 22 electrically connected to the electrodes 4, 4', 3, 3'. The measuring head 13 comprises three test points 14 mounted elastically. The conducting zones 22 are on the fixing elements 6 which pass through the base 5.

A measuring device 15 connected up to the measuring head 13 enables the frequency of at least one resonating function to be measured during the ion etching. This measuring device may be formed by one or more measuring instruments such as wobbulators with maximum-amplitude seeking or network analyzers supplying the variation in the amplitude as a function of the frequency.

A biasing head comparable to the measuring head is connected up to an adjustable biasing source 16.

Figure 2:
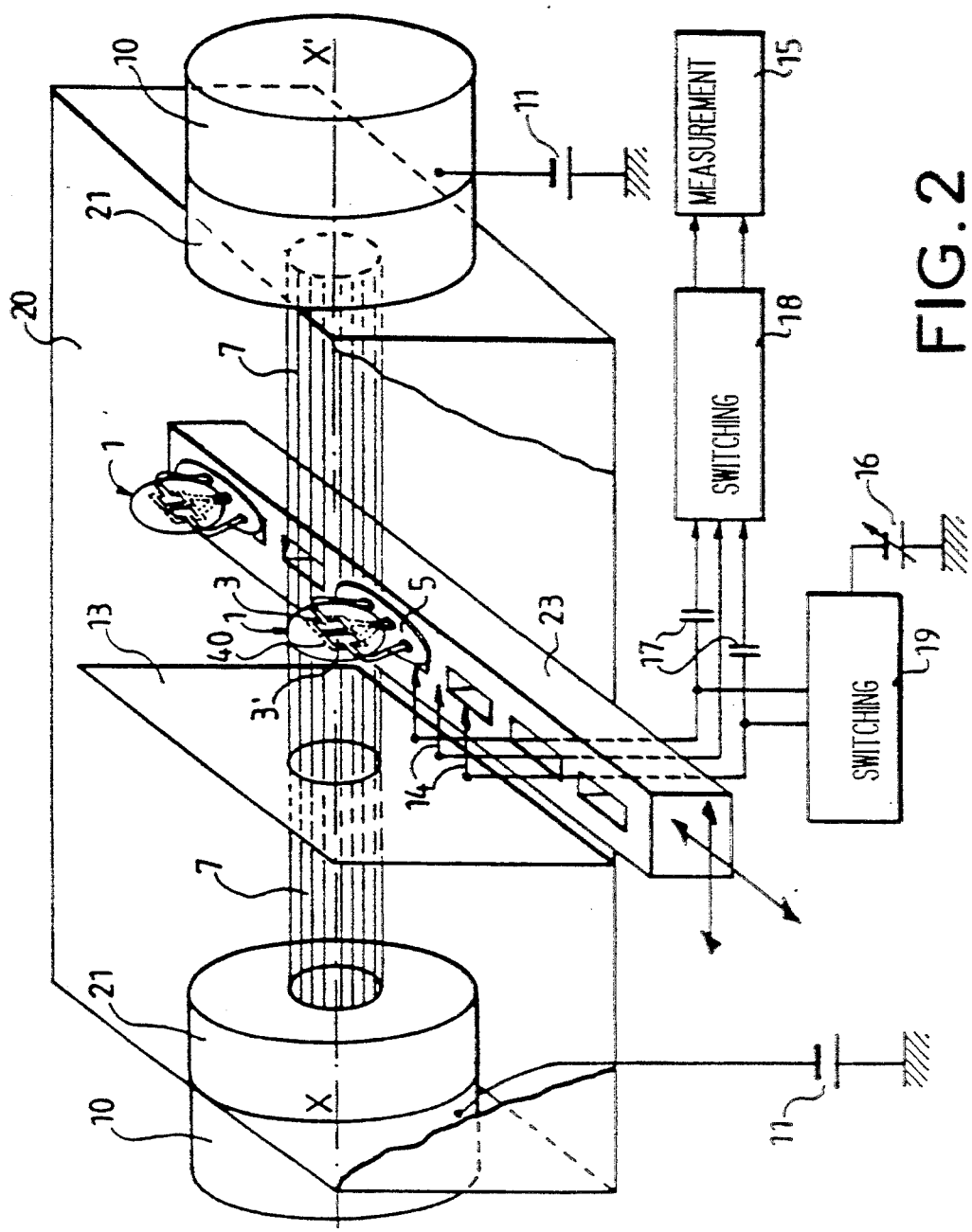
in FIG. 2, a variant of a tuning apparatus according to the invention.

This biasing source 16 may be formed by a plurality of adjustable power supplies (one per electrode exposed to the ion flux or less) or by a single adjustable power supply as in FIG. 2. in FIG. 1a, the biasing head and the measuring head are coincident as a single measuring and biasing head 13.

At least one electrode 4, 4' exposed to the ion flux is biased with the aid of the adjustable biasing source 16 in such a way as to control the rate at which the metal of the electrode 4, 4' is etched by the ions. By biasing the electrode 4, 4', the rate at which the metal is etched is altered in relation to that which it would be without biasing. This biasing enables this electrode 4, 4' to be differentiated in relation to the other electrode or to the other electrodes of the same face which are either non-biased or subjected to another bias voltage.

An isolating device 17 symbolized by capacitors in FIG. 1a is provided for isolating the biasing source 16 from the measuring device 15. It is constituted by any device known in electronics.

When the number of resonating functions to be frequency tuned is greater than the number of frequency-measuring instruments, a first switching device 18 is provided between the measuring and biasing head 13 and the measuring device 15. Switching enables the frequency of all the resonating functions to be measured.

It is also possible to provide a second switching device 19 between the measuring and biasing head 13 and the biasing source 16 if there are more biasing electrodes than power supplies.

The vacuum chamber 20 contains an atmosphere of residual gas held at a specific or regulated level. The gas may be argon.

Reference is now made to FIG. 2.

The piezoelectric device 1 now has two mechanically coupled resonating functions. The plate 2 comprises, on one face, two separate electrodes 3, 3' (one per resonating function) and on the other face an electrode 40 common to the two resonating functions. The remainder of the piezoelectric device is identical to that shown in FIG. 1a. The two faces of the plate are exposed to the ion flux. The ion etching of the metal of the electrodes 3, 3', 40 makes it possible to tune the frequencies of the resonating functions and the coupling between the two resonating functions. The ion source is formed by two ion guns 10 facing each other. The beams 7 which they produce are aligned along the axis XX'.

Whether the resonating functions are coupled or not, it is not desirable to have the quantity of metal between the two electrodes 3, 40 of one resonating function out of balance. If the imbalance is too great, there is a risk of the resonating function having parasitic resonances.

Instead of using diaphragms which interact with the guns 10, it is possible to focus the ion beam 7 by virtue of an optical focusing device 21. An the exit of the optical device 21, the cross-section of the ion beam 7 corresponds to the area to be etched.

The apparatus according to the invention can be completely automated. A plurality of piezoelectric devices 1 to be tuned can be arranged on a carriage system moving along two perpendicular axes, one of which is substantially parallel to the axis XX'. FIG. 2 shows a system having a movable strip 23 which can receive a plurality of piezoelectric devices 1. The carriage system may be controlled automatically or manually.

With an apparatus such as shown in FIG. 1a, a tuning operation will be executed, for example, in the following way:

A piezoelectric device 1, metallized in excess with two resonating functions and mounted on its base 5, is placed in a tuning position. The measuring and biasing head 13 comes into contact with the conducting zones 22 and the frequency of each resonating function is measured. The ion-accelerating voltage is adjusted to its nominal value and the ion etching commences. The frequency of the resonating functions increases. As soon as one resonating function has reached its frequency target value, a bias voltage is applied to its electrode (4, for example) exposed to the ions.

The value of the bias voltage is generally equal to or greater than the ion-accelerating voltage. Thereafter, the erosion of the biased electrode 4 is stopped, whereas it continues on the non-biased electrode 4' of the other resonating function. The resonant frequency of the resonating function provided with the biased electrode 4 no longer changes.

If the piezoelectric device 1 has more than two resonating functions, the exposed electrode of the next resonating function to reach its frequency target value will be polarized in the same manner.

when the final resonating function has reached its frequency target value, it is possible to make the accelerating voltage zero or to bias the final exposed electrode in such a way as to stop the erosion on all the electrodes.

When the bias voltage has a high value, the plate 2 made of piezoelectric material is subjected to a high electric field directed in the direction of its thickness. There is a risk of dielectric breakdown in the plate 2.

In order to avoid this, it is possible to operate in the following way: having installed the piezoelectric device 1, the frequencies of all the resonating functions are measured and compared with their target value.

A bias voltage is applied to one or more exposed electrodes. The bias voltages are chosen in such a manner that all the resonating functions reach their frequency target value in the same ion-flux exposure time.

The values of the voltages are chosen to slow down the rates of erosion, but not to make them zero. The respective differences in the bias voltages between electrodes are fixed by the respective differences between the measured frequency and the frequency to be reached. The frequency variation as a function of the exposure time is substantially linear.

The nominal ion-accelerating voltage is applied. The frequencies of the resonating functions are followed during tuning. The rates of erosion of the various electrodes are different, depending on the applied bias voltages. It is not necessary to bias the electrode of the resonating function furthest from its frequency target value It is possible to correct, if necessary during erosion, the applied bias voltages.

When all the resonating functions have reached their frequency target value, the accelerating voltage is made zero.

The bias voltages are relatively low in relation to the accelerating voltage and the piezoelectric plate is not subjected to too intense an electric field.

With the method according to the invention, the frequency target values of all the resonating functions may be identical or different and the frequencies of each before tuning may be identical or different.

The advantage of this method stems from the absence of mechanical movement involved for differentiating the resonating functions with respect to tuning. The number of electrodes and of resonating functions which are combined together on the same plate is not limited. It is possible to follow the frequency of each resonating function throughout the tuning operation. The definition of the electrodes is not altered after the tuning.

Figure 3:
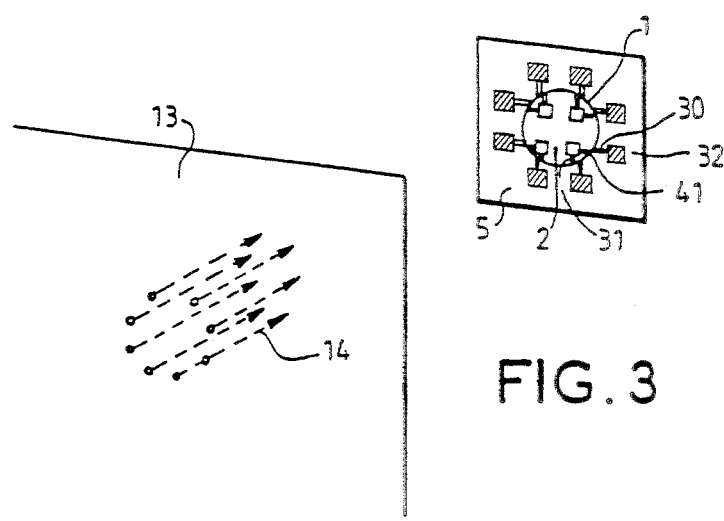
in FIG. 3, a variant of a piezoelectric device in a tuning position.

FIG. 3 shows a piezoelectric device 1 having four uncoupled resonating functions, the device being placed facing the measuring and biasing head 13. There are four electrodes 31, 41 per face on the piezoelectric plate 2. The plate 2 is mounted flat on a ceramic base 5 by adhesive bonding. Eight spots of adhesive 30 ensure both the fixing and the electrical connections of the eight electrodes 31, 41.

Conducting zones 32 are arranged on the base 5 and are electrically connected to the spots of adhesive 30. The measuring and biasing head 13 comprises eight test points 14, mounted elastically, which come into contact with the eight conducting zones 32 of the base 5.

We claim:

1. A method of frequency tuning a piezoelectric device comprising at least one resonating function formed by two metallized electrodes placed facing each other, each on a different face of a plate made of piezoelectric material, comprising the steps of:
   arranging the plate made of piezoelectric material, fitted with metallized electrodes, in a tuning position in proximity to at least one ion source;
   exposing the plate to an ion flux produced by the ion source, the ion flux etching the metal;
   measuring resonant frequency of the resonating function while the plate is in a tuning position; and
   raising at least one electrode exposed to the ion flux to an adjustable bias voltage to control the rate at which the metal on the electrode is etched.

2. The tuning method as claimed in claim 1, further comprising the steps of:
   when the plate made of piezoelectric material comprises a plurality of resonating functions, adjusting the bias voltage applied to one or more electrodes exposed to the ion flux to a value reducing the rate at which the metal on said electrodes is etched to zero as soon as the resonating functions corresponding to these electrodes have reached a frequency target value.

3. The tuning method as claimed in claim 1, further comprising the steps of:
   when the plate made of piezoelectric material comprises a plurality of resonating functions, adjusting the bias voltage applied to one or more electrodes exposed to the ion flux to a value chosen in order that the resonating functions reach a frequency target value in the same ion-flux exposure time.

4. A frequency tuning apparatus for the implementation of the method as claimed in claim 1, wherein it comprises, in a sealed chamber, at least one ion gun producing an ion beam directed along an axis toward one face of the plate made of piezoelectric material, means for measuring the resonant frequency of the resonating function, and means for applying the adjustable bias voltage to the electrode exposed to the ion flux.

5. The frequency tuning apparatus as claimed in claim 4, wherein the ion beam is limited by a diaphragm.

6. The frequency tuning apparatus as claimed in claim 4, wherein the ion beam is focused by a focusing lens.

7. The frequency tuning apparatus as claimed in claim 4, wherein the means for measuring the frequency comprise a measuring device connected to a measuring head coming into electrical contact with the electrodes of the plate made of piezoelectric material.

8. The frequency tuning apparatus as claimed in claim 7, wherein the measuring device comprises one or more measuring instruments.

9. The frequency tuning apparatus as claimed in claim 4, wherein the means for applying the voltage comprise an adjustable voltage source connected to a biasing head coming into electrical contact with the electrodes of the plate made of piezoelectric material.

10. The frequency tuning apparatus as claimed in claim 9, wherein the voltage source is formed by one or more adjustable electric power supplies.

11. The frequency tuning apparatus as claimed in claim 4, wherein the measuring head and the biasing head are coincident.

12. The frequency tuning apparatus as claimed in claim 4, wherein the piezoelectric device is supported, together with one or more other piezoelectric devices to be tuned, by a carriage device which can move along two substantially perpendicular axes, one of which is directed along the axis of the ion beam.

* * * * *